(12) United States Patent
Dick et al.

(10) Patent No.: US 6,600,788 B1
(45) Date of Patent: Jul. 29, 2003

(54) NARROW-BAND FILTER INCLUDING SIGMA-DELTA MODULATOR IMPLEMENTED IN A PROGRAMMABLE LOGIC DEVICE

(75) Inventors: Christopher H. Dick, San Jose, CA (US); Frederic J. Harris, San Diego, CA (US)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 09/394,123

(22) Filed: Sep. 10, 1999

(51) Int. Cl.[7] ............................................. H04B 14/06
(52) U.S. Cl. ...................... 375/245; 375/232; 375/243; 375/247
(58) Field of Search ............................. 375/232, 245, 375/243, 247

(56) References Cited

U.S. PATENT DOCUMENTS

| | | | |
|---|---|---|---|
| 5,471,209 A | * 11/1995 | Sutterlin et al. | ............ 375/245 |
| 5,493,296 A | * 2/1996 | Sugihara | ...................... 341/200 |
| 6,356,872 B1 | * 3/2002 | Leung et al. | ............... 704/229 |

OTHER PUBLICATIONS

Dick, C.H. and Harris, F.: "On the Re–quantization of Data to Implement High–Order Narrow–Band Filters using Reconfigurable Logic," Asilomar Conference, 1996.*

L. Mintzer, "FIR Filters with Field–Programmable Gate Arrays", Journal of VLSI Signal Processing, No. 6, 1993, pp. 119–127.

S. Mohanakrishnan et al., "Automatic Implementation of FIR Filters on Field Programmable Gate Arrays", IEEE Signal Processing Letters, vol. 2, No. 3, Mar. 1995, pp. 51–53.

D. Patterson et al., "Computer Architecture: A Quantitative Approach", Morgan Kaufmann Publishers, Inc., California, 1990, pp. A8–A10.

Marvin E. Frerking, "Digital Signal Processing in Communication Systems", published by Van Nostrand Reinhold, New York, 1994, pp. 124–128 and 171–174.

John R. Deller, Jr. et al., "Discrete Time Processing of Speech Signals", published by Macmillan Publishing Company, Maxwell Macmillan International, New York, 1993, pp. 273–280.

"The Programmable Logic Data Book", 1999, available from Xilinx, Inc., 2100 Logic Drive, San Jose, California 95124, pp. 6–5 to 6.41.

* cited by examiner

Primary Examiner—Chi Pham
Assistant Examiner—Demetria Williams

(57) ABSTRACT

A narrow-band bandpass filter is implemented in a field programmable gate array (FPGA). An analog-to-digital converter quantizes an input analog signal with a high degree of precision to produce input data samples. A sigma-delta modulator re-quantizes the samples with a substantially lower degree of precision. The re-quantized samples are passed through a bandpass, lowpass, or highpass, finite impulse response (FIR) filter which operates at the lower degree of precision. The reduced degree of precision enables a substantial reduction in the number of resources required to implement the narrow-band bandpass, lowpass, or highpass filter in the FPGA. The modulator includes a predictor filter which has a center frequency coinciding with that of the FIR filter, and redistributes noise such that it is lowest within the passband of the FIR filter. The narrow-band filter design can be adapted to incorporate a single or multi-rate decimator configuration.

4 Claims, 9 Drawing Sheets

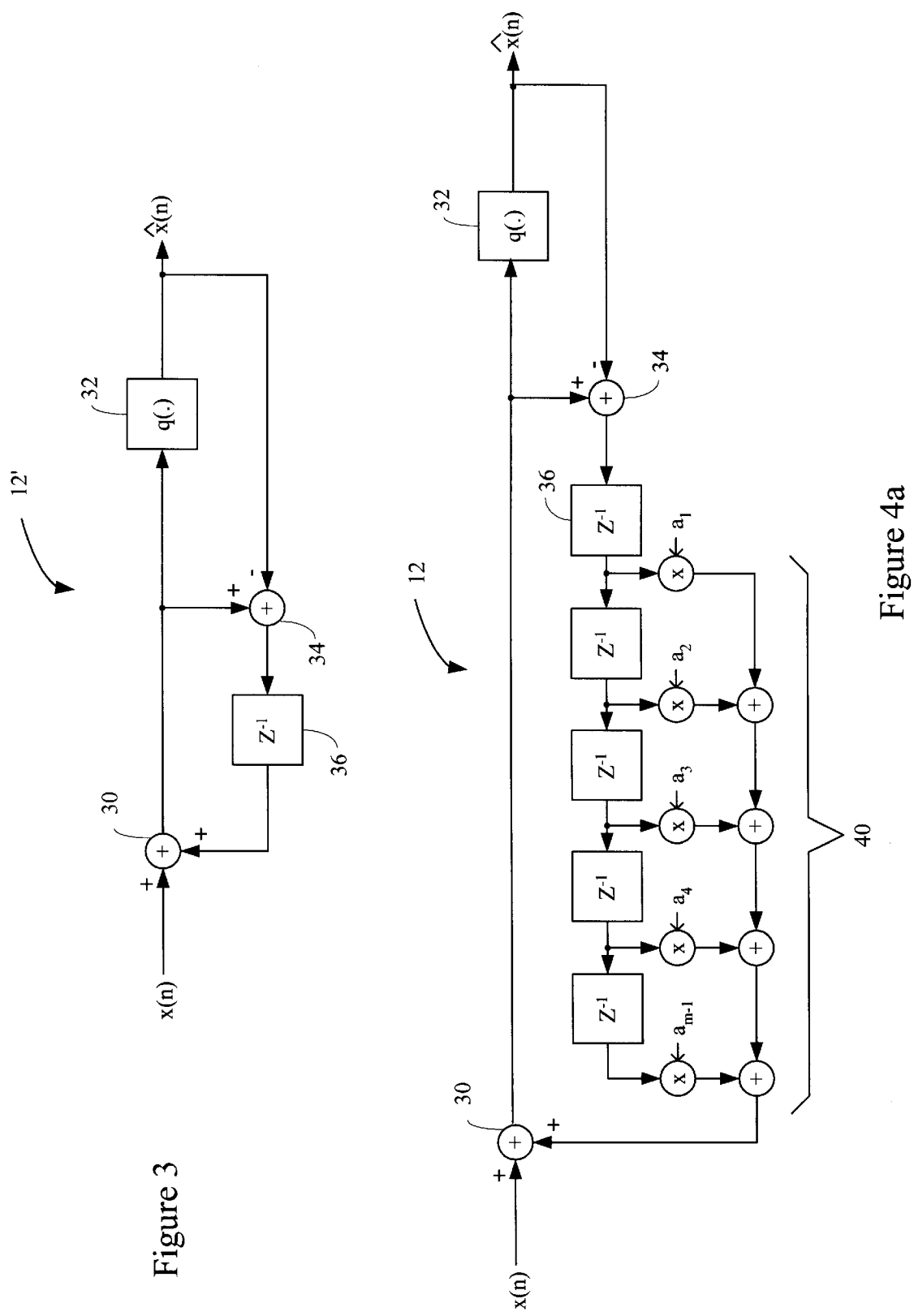

NARROW-BAND FILTER INCLUDING SIGMA-DELTA MODULATOR IMPLEMENTED IN A PROGRAMMABLE LOGIC DEVICE

FIELD OF THE INVENTION

The present invention generally relates to the art of electronic filters, and more specifically to a narrow-band filter including a sigma-delta modulator implemented in a programmable logic device.

BACKGROUND OF THE INVENTION

Narrow-band filters, especially finite impulse response (FIR) filters, are utilized in many applications including narrow-band communication receivers, multi-channel RF surveillance systems, and spectrum management solutions. Representing data within a specified dynamic range is frequently accomplished by quantizing the data using a quantizer operating at the Nyquist rate. Each additional bit of resolution in the quantizer provides an increase in dynamic range of approximately 6 dB. Thus, a signal with 60 dB of dynamic range requires 10 bits, whereas 16 bits can represent data with a dynamic range of 96 dB.

A field programmable gate array (FPGA) is a type of programmable logic device (PLD) including a large number of configurable logic blocks (CLBs) that can be programmed and interconnected to implement a desired functional design. Because of the architecture of the FPGA, many filters, and specifically FIR filters, can be easily implemented. An exemplary treatise on this subject is found in an article entitled, "FIR Filters with. Field-Programmable Gate Arrays," by L. Mintzer, Journal of VLSI Signal Processing, No. 6, pp. 119–127 (1993), incorporated by reference herein. Once the design of the FIR filter has been determined, the configuration for implementation in an FPGA can be computed automatically. An example of a computer-aided design (CAD) system which provides this capability is described in an article entitled, "Automatic Implementation of FIR Filters on Field Programmable Gate Arrays," by S. Mohanakrishnan et al, IEEE Signal Processing Letters, Vol. 2, No. 3, pp. 51–53, March 1995, also incorporated by reference herein.

While the required dynamic range of a system fixes the number of bits required to represent the data as indicated above, it also affects the expense of subsequent arithmetic operations, in particular multiplications. In any hardware implementation, including FPGA- based DSP processors, there are strong economic imperatives to minimize the number and complexity of the arithmetic components employed in the datapath. Specifically, high precision filters, as expressed by the number of binary bits representing the values of the data samples, require high precision multipliers and other elements that must be implemented in an FPGA. Among the functional logic elements of a FIR filter, the multipliers require the largest utilization of resources in the form of CLBs and associated circuitry.

It is possible to implement a FIR filter using only one multiplier, and schedule the multiplier in a time division multiplexed manner to perform the filter calculation. Although: this reduces the number of CLBs needed, the operational speed of the filter would be severely reduced. In fact, in a real-time application, the operational speed could be so low that the filter would be inoperative for its intended use. A compromise solution is to provide a number of multipliers, and then share the multipliers and other elements that must be implemented in the FPGA.

The constant advance of technology requires filters of ever increasing size, complexity, and speed. Thus, the prior art solution of multiplexing a relatively small number of multipliers and other elements is not sufficient to provide the level of performance required for a high performance FIR filter implemented in an FPGA. Therefore, a need exists for overcoming the limitations of the prior art and fulfilling the desired requirements.

SUMMARY OF THE INVENTION

In accordance with the present invention, noise shaping is employed to reduce the precision of the input data samples so that the complexity of the multiply-accumulate units in the filter can be minimized. The net result is reducing the amount of field programmable gate array (FPGA) logic resources required to realize a filter while increasing the size and complexity and/or the operating speed of the filter, all without degradation of signal quality over a specified band of frequencies.

To achieve this result, the present invention implements a narrow-band filter in the FPGA. The narrow-band filter includes an analog-to-digital (A/D) converter, a sigma-delta ($\Sigma\Delta$) modulator, and a lowpass, bandpass, or highpass finite impulse response (FIR) filter. The A/D converter quantizes an input analog signal with a high degree of precision to produce input data samples. The sigma-delta ($\Sigma\Delta$) modulator re-quantizes the samples to a substantially lower degree of precision. The re-quantized samples are then passed through the FIR filter that operates at the same degree of precision as the modulator output data. The lower degree of precision reduces the number of resources required to implement the FIR filter in the FPGA.

In one embodiment, the $\Sigma\Delta$ modulator includes a bandpass predictor filter which has the same center frequency as that of the bandpass FIR filter. In this manner, the $\Sigma\Delta$ modulator redistributes noise such that it is lowest within the passband of the bandpass FIR filter, thereby preventing the signal integrity from being compromised within the passband.

The narrow band filter design of the present invention can be adapted to incorporate a single or multi-rate decimator configuration.

BRIEF DESCRIPTION OF THE DRAWINGS

FIG. 3 is a signal flow graph illustrating one sigma-delta ($\Sigma\Delta$) modulator.

FIG. 4a is a signal flow graph illustrating an alternative $\Sigma\Delta$ modulator including a predictor filter.

Like elements in the figures are designated by the same reference numerals.

DETAILED DESCRIPTION OF THE DRAWINGS

Figure 1:
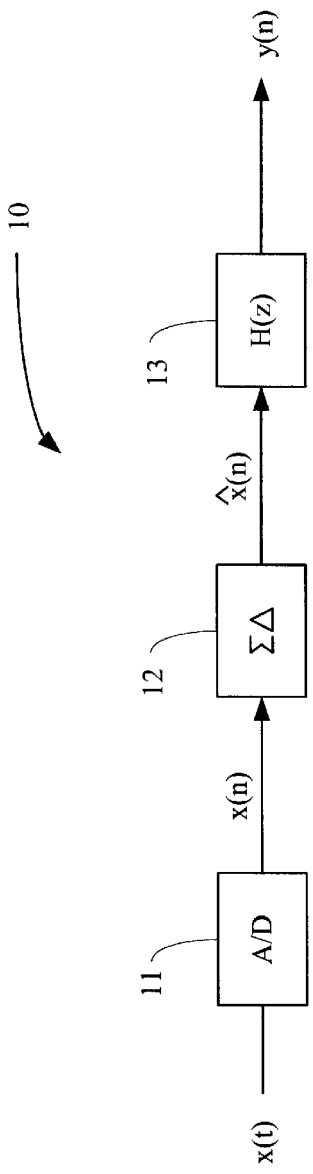
FIG. 1 is a signal flow graph illustrating a narrow-band filter according to the present invention.

FIG. 1 illustrates a narrow-band filter 10 according to the present invention. Filter 10, a single-rate or single phase filter, includes a quantizer in the form of an analog-to-digital (A/D) converter 11 which receives a temporal analog input signal x(t) and produces quantized input data samples x(n) at a relatively high degree of precision as expressed by the number of binary bits representing the values of the data samples x(n). The quantized samples x(n) are then re-quantized by a sigma-delta (ΣΔ) modulator 12 with a lower degree of precision to produce re-quantized input samples $\hat{x}(n)$. Finally, a FIR bandpass filter 13, with frequency response H(z), filters the samples $\hat{x}(n)$ to produce output data samples y(n).

Figure 2:
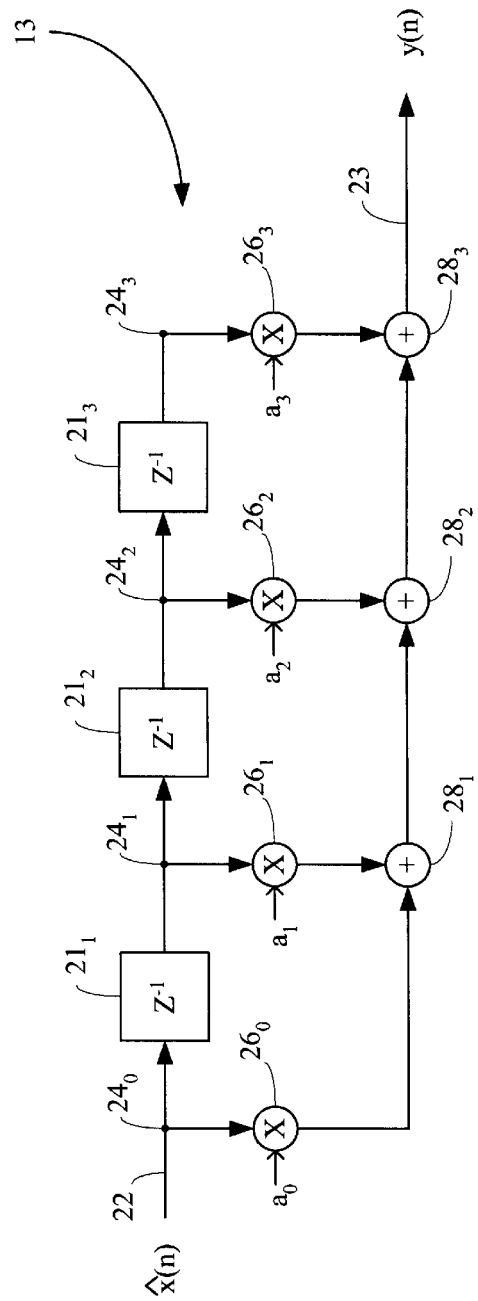
FIG. 2 is a signal flow graph illustrating a finite impulse response (FIR) filter.

FIG. 2 illustrates one embodiment of FIR filter 13 which receives a sequence of re-quantized input data samples $\hat{x}(n)$ at an input terminal 22 and produces a sequence of output data samples y(n) at an output terminal 23, where n is the sample index (sample number). Filter 13 includes a plurality of taps $24_0$ to $24_3$. Unit delays $21_1$ to $21_3$, connected between the taps, each provide a unit delay $Z^{-1}$ of one clock period. Input data samples $\hat{x}(n)$ are clocked through delays $21_1$ to $21_2$ and appear sequentially at taps $24_0$ to $24_3$ in a bucket brigade manner.

Taps $24_0$ to $24_3$ are connected to the respective input terminals of a plurality of multipliers $26_0$ to $26_3$. Filter coefficients $a_0$ to $a_3$ are provided to the second input terminals of multipliers $26_0$ to $26_3$, and are multiplied by the input data samples at taps $24_0$ to $24_3$ respectively. The output terminals of multipliers $26_0$ to $26_3$ are connected to the respective input terminals of a plurality of adders $28_1$ to $28_3$. Each combination of a multiplier and adder (e.g. multiplier $26_0$ and adder $28_1$) constitutes a multiple-accumulate unit (MAC). The output terminal of multiplier $26_0$ is connected to a second input terminal of adder $28_1$. The output terminals of adders $28_1$ and $28_2$ are connected to second input terminals of adders $28_2$ and $28_3$ respectively. Adder $28_3$ provides the output data samples y(n) on the output terminal 23.

Expressed mathematically, FIR filter 13 implements an arithmetic "sum of products" algorithm, and more specifically the function:

$$y(n) = \sum_{k=0}^{N-1} a_k x(n-k)$$

where N is the number of filter taps. Note that the multiplication of a filter coefficient $a_i$ by an input sample x(n) is based on a multi-bit inspection version of Booth's algorithm, described in detail in "Computer Architecture: A Quantitative Approach", pages A8–A10, by D. Patterson et al, Morgan Kaufmann Publishers Inc. California, 1990. In operation, each successive input data sample is multiplied by the filter coefficient at its current tap position, whereas the successive sample is multiplied by the filter coefficient at the previous tap position. The products of each sample and successive sample are summed by the associated adder and applied to the next adder in the chain.

FIR filter 13 can be configured to provide a variety of transfer functions, including low pass, high pass, and bandpass. As known by those skilled in the art, the desired transfer function is determined by selection of filter coefficients $a_0$ to $a_{N-1}$. FIR filter 13, having a selected center frequency and passband by suitable selection of the filter coefficients, functions as a narrow-band filter. Of importance, the re-quantized input data samples $\hat{x}(n)$ are represented using fewer bits of precision per sample than the original quantized input data samples x(n), thereby permitting FIR filter 13 to employ reduced precision multipliers in the process. However, note that filter coefficients $a_0$ to $a_3$ are kept to a high precision, such as 16 bits.

FIG. 3 illustrates one embodiment of a ΣΔ modulator 12' that performs a re-quantization function. Modulator 12', based on a single loop design, includes an adder 30 that receives the samples x(n) at a first positive input terminal. A quantizer 32 (representing the quantization process) receives the output signal of adder 30 and in turn outputs the re-quantized samples $\hat{x}(n)$ with a lower degree of precision than the samples x(n). Adder 34 receives an output signal of quantizer 32 as well as the output signal of adder 30 via its negative and positive input terminals, respectively. The output signal of adder 34 is provided through a unit delay 36 to a second positive input terminal of adder 30. In this configuration, adder 34 calculates the difference (i.e., quantization error) between a high precision sample x(n) and the corresponding low precision sample $\hat{x}(n)$, and applies the negative of this difference to unit delay 36. Adder 30 adds the error to the next sample x(n). Thus, modulator 12' operates on a highly, oversampled input signal and uses unit delay 36 as a generalized predictor. However, modulator 12' only functions on a baseband signal, i.e. a signal near 0 Hz. Moreover, in using modulator 12', only a small fraction of the bandwidth can be occupied by the required signal. A larger fraction of the Nyquist bandwidth can be made available if a more sophisticated error predictor is employed.

FIG. 4a illustrates one embodiment of ΣΔ modulator 12 of the present invention. To provide accurate error prediction, modulator 12 includes a predictor filter 40 located between unit delay 36 and adder 30. Predictor filter 40 is a FIR filter having a configuration similar to that of filter 13 (FIG. 2)(thus, individual elements of predictor filter 40 are not designated by reference numerals). Predictor filter 40 is configured as a bandpass filter which is tunable to a selected center frequency with a selected bandpass range by selecting appropriate filter coefficients $a_1$ to $a_{(m-1)}$. Of importance in the present invention, the center frequency of predictor filter 40 is selected to be the same as that of FIR filter 13 (FIG. 1).

The present invention takes advantage of the fact that the passband of FIR filter 13 occupies a substantially less frequency band than the bandwidth corresponding to the Nyquist frequency of A/D converter 24. ΣΔ modulator 12 functions to redistribute noise in the re-quantized input data samples $\hat{x}(n)$ such that the noise is minimum within the passband of filter 13, and substantially larger outside the passband. Note that the large noise outside the passband of interest is not a problem because the frequencies outside the passband will be rejected by FIR filter 13. The redistribution of noise such that the passband is substantially unaffected enables the re-quantized samples x̂(n) to be represented with a reduced degree of precision compared to the samples x(n) without comprising the integrity of the frequencies within the passband.

The operation of ΣΔ modulator 12 can be understood by considering the following transform domain description of the circuit:

$$\hat{X}(z)=X(z)+Q(z)(1-P(z)z^{31}\ 1)$$

where Q(z) is the z-transform of the equivalent noise source added by quantizer 32 (q(.)), P(z) is the transfer function of predictor filter 40, and X(z) and $_{\hat{x}}$(z) are the transforms of the system input and output, respectively.

The Transfer function P(z) is designed to have unity gain and leading phase shift in the bandwidth of interest. Within this bandwidth, the term $Q(z)(1-P(z)z^{-1})=0$, thus $_{\hat{x}}(z)=X(z)$. By designing the transfer function of predictor filter 40 to be commensurate with the system passband specifications, the in-band spectrum of the output signal of modulator 12 will ideally be the same as the corresponding spectral region of the input sample.

An important aspect of implementing modulator 12 is producing an efficient implementation for predictor filter 40. The desire to support high-sample rates, and the requirement of zero latency for predictor filter 40, preclude the use of bit-serial methods. In addition, to increase area efficiency, parallel multipliers that exploit one time-invariant input operand (the filter coefficient) will be used, rather than general variable-variable multipliers.

Predictor filter 40 is in the feedback path of modulator 12. Thus, the multipliers in predictor filter 40 must not contain pipeline (delay) elements. Although additional pipelined multipliers in this circuit would maximize the sample rate throughput, additional delay in the feedback path changes the modulator transfer function, thereby rendering it inoperable for the intended use.

Operation of the Present Invention

Figure 5A:
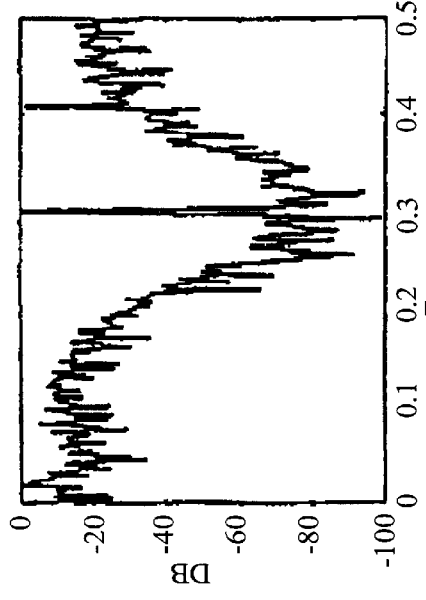
FIG. 5a is the spectrum of an example test signal.
Figure 5B:
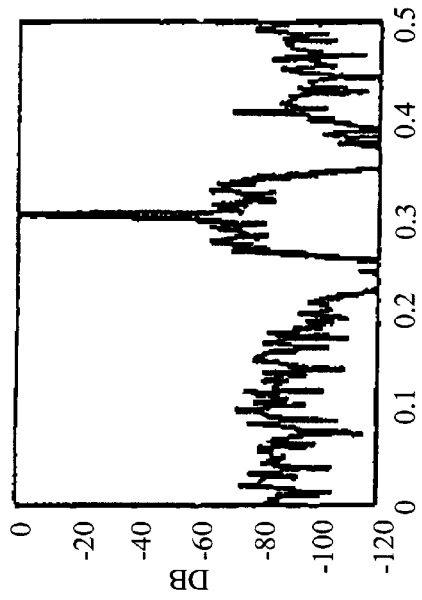
FIG. 5b is the spectrum of the output waveform of $\Sigma\Delta$ modulator 12 (FIG. 4a) when the test signal is the input stimulus.
Figure 5C:
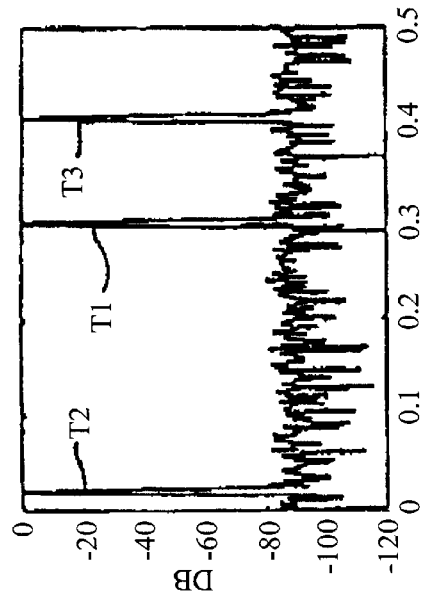
FIG. 5c is an example frequency response of FIR filter 13 (FIG. 1).
Figure 5D:
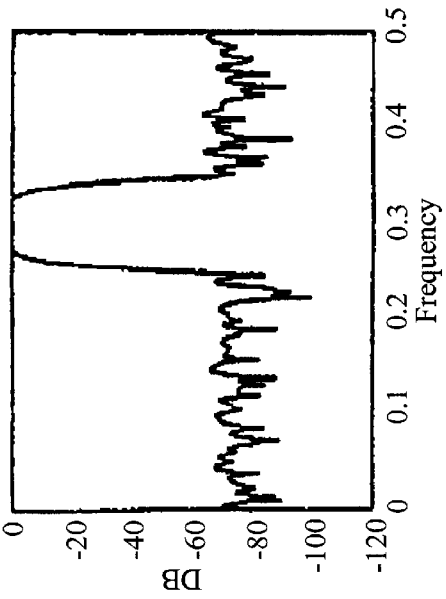
FIG. 5d is the spectrum of the output signal y(n) of FIR filter 13.

To illustrate the operation of the present invention, consider the task of recovering a signal that occupies 10% of the available bandwidth and is centered at a normalized frequency of 0.3 Hz. The stopband requirement is to provide 60 dB of attenuation. FIG. 5a shows an input test signal including an in-band tone $T_1$ and two out-of-band tones $T_2$ and $T_3$ that are to be rejected. FIG. 5b is a frequency domain plot of the test signal after it has been re-quantized to 4 bits of precision by a ΣΔ modulator employing an 8th order predictor filter in the feedback path. Note that the 60 dB dynamic range requirement is supported in the bandwidth of interest, but the out-of-band signal-to-noise (SNR) has been compromised. However, in this example, a 160-tap FIR filter (such as FIR filter 13) provides the necessary rejection. The frequency response H(z) of the FIR filter using 12-bit filter coefficients is shown in FIG. 5c. Finally, the FIR filter is applied to the reduced sample precision data stream x̂(z) to produce the spectrum shown in FIG. 5d. As shown in FIG. 5d, the desired tone has been recovered, the two out-of-band tones have been rejected, and the in-band dynamic range meets the 60 dB requirement.

FPGA Implementation

Once the design of the narrow band filter has been finalized, an FPGA can be programmed to implement that design in a known manner (see, for example, the above-referenced article to Mintzer).

The implementation generally includes the following steps:
  (a) providing an unprogrammed FPGA or other PLD;
  (b) creating a configuration bitstream for the FPGA which implements the filter design; and
  (c) programming the FPGA-using the configuration bitstream.

The user can obtain the-configuration bitstream from a digital storage medium, such as a floppy disk or CD-ROM, or download a bitstream remotely generated by a provider. Alternatively, the user can obtain the filter design from another source and generate the configuration bitstream himself using a CAD program or other means (see, for example, the above-referenced article to Mohanakrishnan). Clearly, the user also has the option to design the filter himself. The present invention encompasses all of the above-enumerated alternatives.

In one embodiment, a narrow-band filter 10 is implemented in a Xilinx XC4000™ FPGA. Detailed information on this series of FPGAs is found in "The Xilinx Programmable Logic Data Book, 1999", pages 6–5 to 6–41, which are incorporated herein by reference. Each configurable logic block (CLB) in the XC4000 FPGA includes, two function generators, each function generator having four input terminals. Each function generator can be used for combinatorial logic or as user memory. Specifically, in the XC4000 FPGA, each of the two function generators, implemented as a look-up table (LUT) can provide a 16×1 memory.

Typically, each bit of precision in a data sample stream contributes 6 dB of dynamic range. If the final filtered result must provide a 60 dB difference between the passband and stopband frequencies, then the input signal must also support this range. As noted above, each function generator in a Xilinx XC4000 or Virtex FPGA has 4 input terminals. Therefore, it is convenient to choose the precision P of the input samples such that P is a multiple of 4 (to match the number of function generator input terminals) and also so that 6P is greater than 60. Thus, in one embodiment, 12-bit precision is applied to the input samples because 12 is a multiple of 4 and it is also the first multiple of 4 that satisfies the 60 dB (6×12=72 (>60)) requirement.

Figure 12:
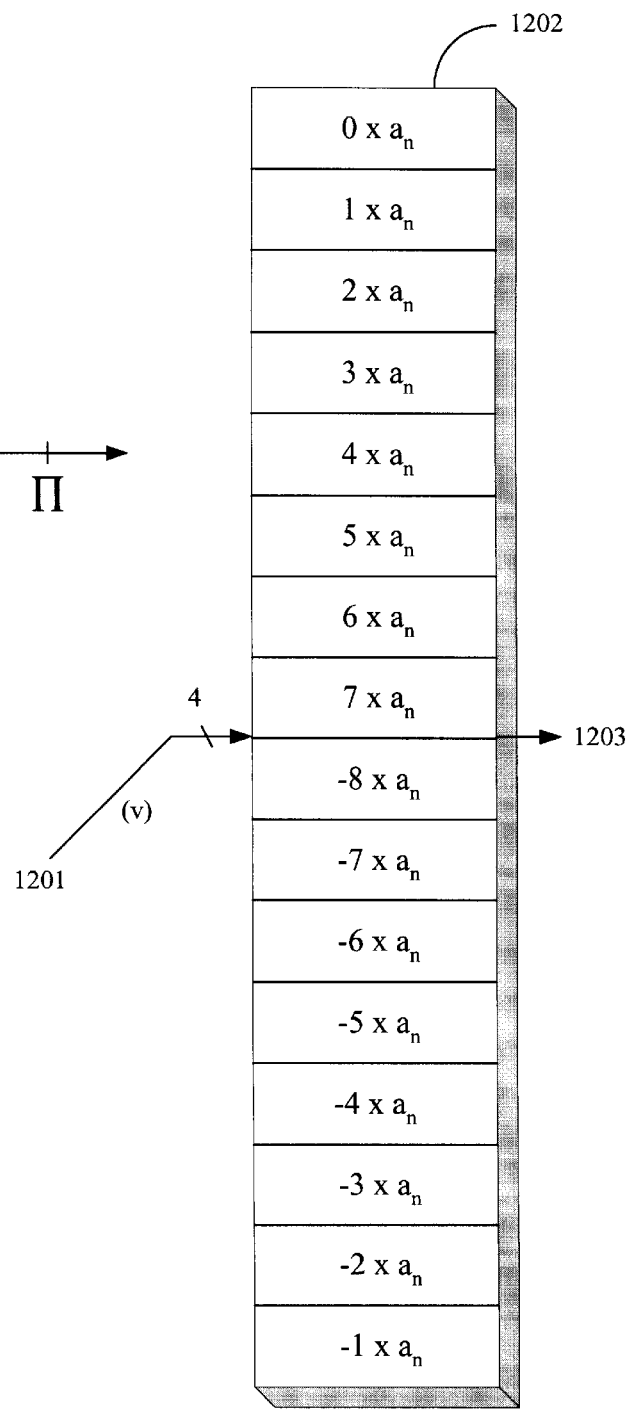
FIG. 12 is a look-up table constant coefficient multiplier.

Note that each 12-bit data sample then consists of 3 4-bit "nibbles", wherein a nibble is a 4-bit wide digital quantity. As shown in FIG. 12, each nibble 1201 is used as the address input of a memory 1202 ($2^4$=16 deep)(i.e. one LUT) which includes integer multiples of $a_n$, the nth filter coefficient. As apparent to those skilled in the art, this circuit performs a multiplication between the address bus value (v) and coefficient $a_n$. The product is presented on a memory output terminal 1203.

Although 12 bits are adequate to represent the filter coeficients, LUT entries must be greater than 12 bits. Thus, after designing the required filter, i.e. determining the set of filter coefficients that are required to satisfy a particular problem, the filter coefficents are scaled so that the largest value coresponds to +1. Using a 12-bit representation, this number would be 0X7FF, where "0X" denotes a number in base 16. The contents of memory 1202 are integer multiples of the filter coefficients. There are 16 possible values. To allow for the word growth associated with computing the integer multiples of a coefficient, additional bits, over and above the number of bits used for the coefficient values, must be employed. In this case, 4 additional bits are provided ($\log 2(16)=4$). Because the coefficients were originally 12-bit samples, the additional 4 bits gives a total of 16 bits for the LUT precision.

In the above implementation, three nibbles of an input sample concurrently address three LUTs. The LUT outputs are added together to form the final output. In accordance with one embodiment of the present invention, a weighted summation that reflects a nibble's position in the input sample is employed.

Figure 4B:
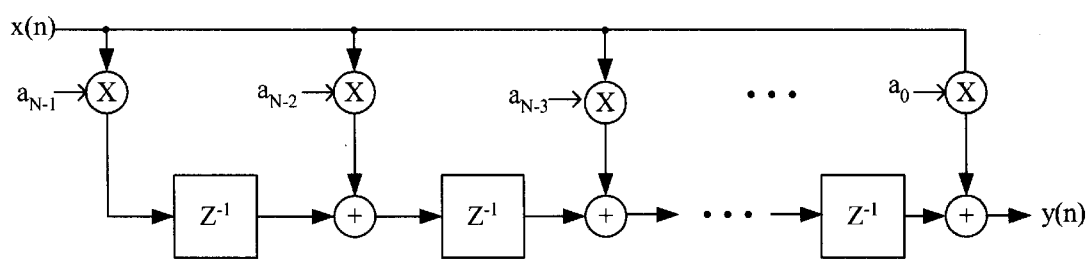
FIG. 4b is a signal flow graph illustrating a transposed FIR filter.

Note that predictor filter 40 (FIG. 4a) is drawn in a "direct" form realization. FIG. 4b illustrates an alternative, functionally equivalent, "transposed" FIR filter 41 having N-taps. One advantage of transposed filter 41 is that a register (delay) immediately follows each adder in the summation path. In the Xilinx XC4000 and Virtex FPGAs, an adder and register combination occupy the same FPGA CLB. In addition, the positioning of the registers minimizes the longest combinatorial path in modulator 12 which, in turn, minimizes the operating frequency of modulator 12. Therefore, one embodiment of the present invention employs transposed FIR filter 41, rather than direct form filter 40.

The length (i.e. number of taps) of predictor filter 40 (or transposed filter 41) controls the width and dynamic range of the passband of modulator 12. Thus, the predictor length must be selected for each problem. The equations that define the transfer function of predictor filter 40 are described in a later section, however note that these equations should be implemented in a mathematical modelling environment, such as Matlab (see, "The Mathworks, Matlab Users Manual", Boston, Mass.), and simulations performed until a predictor length that satisfies the specific problem is determined experimentally. In one embodiment, simulation of the example design of a 9-tap predictor filter is sufficient to meet the example specifications.

The FPGA logic requirement for modulator 12, using a 9-tap predictor filter, is $\Gamma(P(z))=9\times 40+64=424$ CLBs. A small amount of additional logic, i.e. 26 CLBs, is required to complete modulator 12. Thus, the final CLB count is 450. In this embodiment, modulator 12 operates comfortably with a 50 MHz clock.

Reduced Complexity FIR Filter

In accordance with the present invention, because the input sample is now available as a reduced precision data stream, filtering can be performed using area-optimized hardware. For the reasons discussed above, 4-bit data samples are a convenient match for XC4000 devices. The samples $\hat{x}(n)$ are presented to the address inputs of N look-up table-based constant coefficient multipliers, where N is the number of taps in filter 13 (FIG. 1).

As previously noted, the output signals of the multipliers are combined with an add-delay (adders 28 and delays 21) datapath to produce the final result. Therefore, in the present invention, the logic requirement for FIR filter 13 is:

$$\Gamma(H(z))=N\Gamma(MUL)+(N-1)\Gamma(ADD\_z^{-1})$$

where $\Gamma(MUL)$ and $\Gamma(ADD\_z^{-1})$ are the FPGA area cost functions for a reduced complexity multiplier and an add-delay datapath component, respectively.

In a prior art implementation, each multiplier (12×12 bit) occupies 40 CLBs and 8 CLBs are required for an add-delay component. Therefore, the total cost of a direct implementation of a FIR filter is 7672 CLBs.

In contrast, in the present invention, the multipliers (4×12 bit) each consume only 8 CLBS. Therefore, even including the additional resources required to implement modulator 12, the CLB count is 3002. Thus, the present invention consumes only 39% of the logic resources of a prior art direct implementation.

Decimators

The narrow-band filter of the present invention as implemented above is a single-rate filter. In various applications having large sample rates, it may not be feasible to design FIR filter 13 to operate at the same high sample rate as A/D converter 11. In such applications, a polyphase or multi-rate configuration (also known as a decimator configuration) can be used to reduce the sampling rate required of FIR filter 13. In a decimator configuration, the input sample is divided into two or more components that are processed by a plurality of FIR filters in a time-multiplexed manner. For an m-phase decimator, each FIR filter is able to operate at a sampling rate of R/m, where R is the input sampling rate of A/D converter 11.

Figure 6:
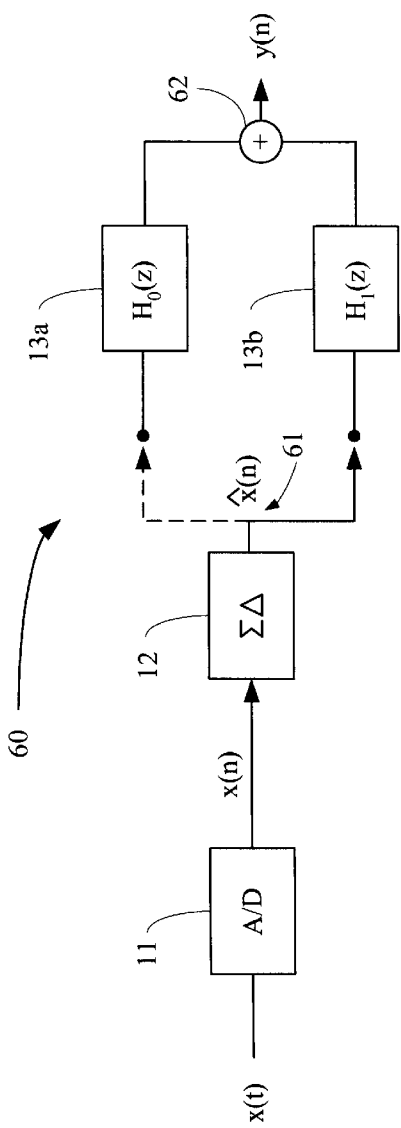
FIG. 6 is a signal flow graph illustrating a narrow band filter including one decimator configuration according to the present invention.

FIG. 6 illustrates a narrow band filter 60 having a decimator configuration in which FIR filter 13 is replaced by two filter sections 13a and 13b. In one embodiment, a commutator 61 switches the output of modulator 12 between the input terminals of sections 13a and 13b on alternate clock cycles. The output signals of sections 13a and 13b are summed by an adder 62 to provide the output data samples y(n).

Figure 7:
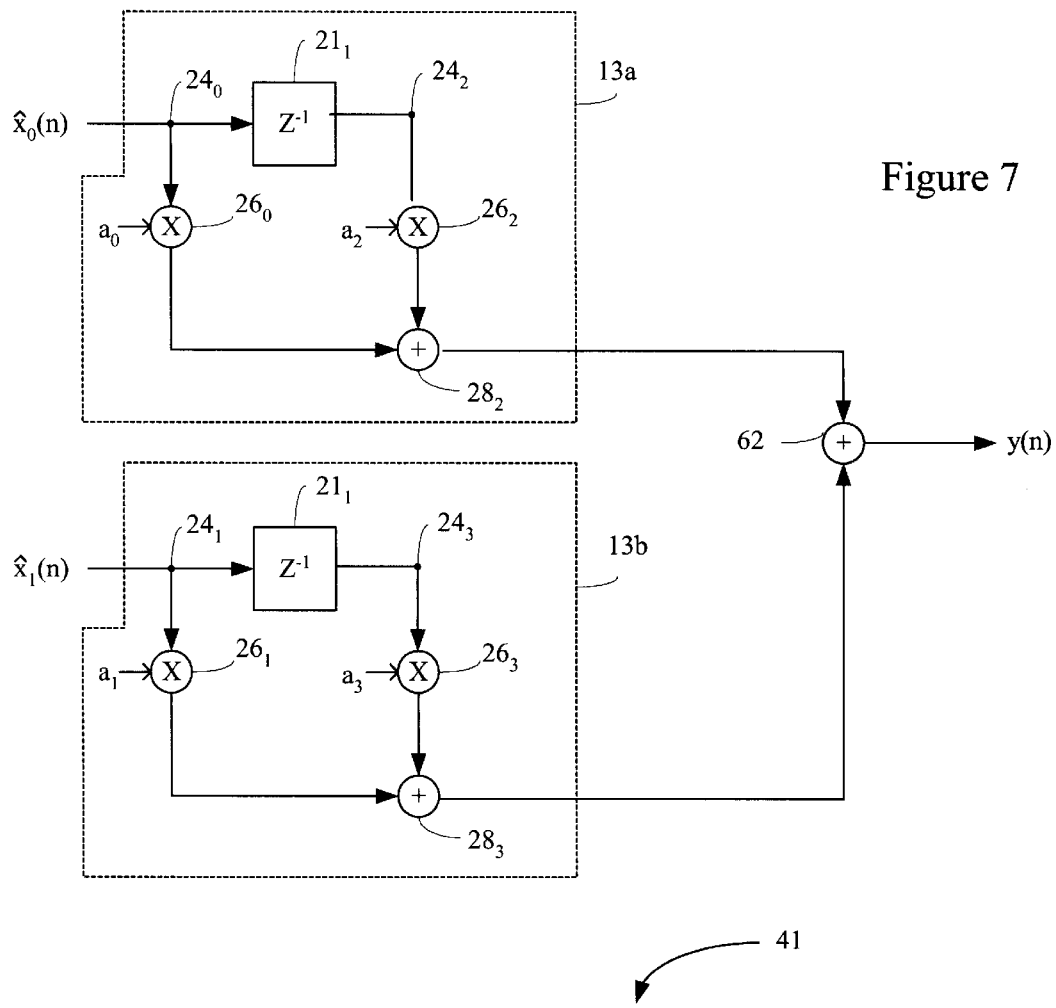
FIG. 7 is an example signal flow graph illustrating the two FIR filter sections in a dual-phase decimator arrangement.

FIG. 7 illustrates an embodiment of sections 13a and 13b in greater detail. In this embodiment, using FIG. 2 as an exemplary FIR filter, taps $24_0$ to $24_3$ and associated elements are divided between the two sections such that even-numbered elements are in section 13a and odd-numbered elements are provided in section 13b. Sections 13a and 13b alternatingly receive re-quantized input samples $\hat{x}_0(n)$ and $\hat{x}_1(n)$ and alternatingly apply corresponding output data samples to adder 62. Thus, the sampling rate of each section 13a and 13b has been reduced to one-half that of A/D converter 11. As known by those skilled in the art, the number of taps is dependent on the intended application. Thus, although FIG. 7 shows only 2 taps in each sub-filter 13a and 13b, most actual applications would require more than 2 taps.

In some FPGA-implemented applications having high input sample rates (i.e., greater than 100 MHz), high-performance multipliers are typically required for re-quantizing the source data. However, high-performance multipliers are typically implemented by incorporating pipelining in the design, thereby naturally introducing some latency into the design. However, the location of predictor filter 40 (FIG. 4) requires a zero-latency design.

Figure 8:
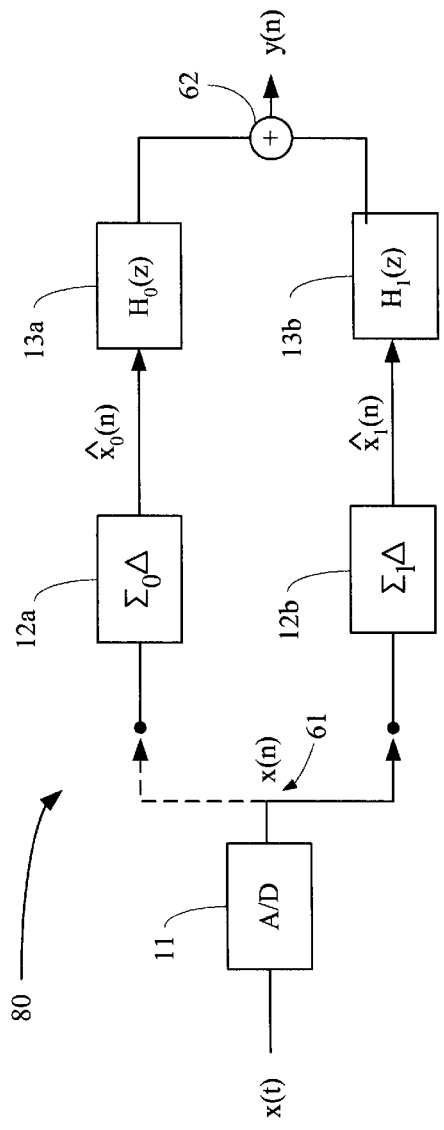
FIGS. 8 and 9 are signal flow graphs illustrating narrow band filters including various decimator configurations according to the present invention.

Therefore, instead of re-quantizing, decimating, and filtering, thereby requiring a $\Sigma\Delta$ modulator to run at the input sample rate, this sequence of operations may be re-ordered to permit several slower modulators to be used in parallel. As shown in FIG. 8, the process is performed by first decimating the sample using two modulator sections 12a and 12b, re-quantizing, and then filtering, thereby allowing modulator sections 12a and 12b to operate at a reduced output sample rate.

In one embodiment, commutator 61 provides the output signal of A/D converter 11 to the input terminals of modulator sections 12a and 12b on alternate clock cycles. The output signals of modulator sections 12a and 12b are applied to the input terminals of FIR filter sections 13a and 13b respectively. Note that the predictor filters of modulator sections 12a and 12b are divided in a manner similar to that described above with reference to FIG. 7, wherein even-numbered taps and associated elements are provided in modulator section 13a and odd-numbered taps and associated elements are provided in modulator section 13b.

To support arbitrary center frequencies, and any arbitrary (integer) down-sampling factor, predictor filter 40 must employ complex values for coefficients $a_1, a_2, \ldots, a_{m-1}$ in FIG. 4a. The term down-sampling refers to the process of reducing the sample rate of the signal stream. For example, if a sample stream is available at a sample rate of F, and it is down-sampled by an integer factor f, then the new sample rate is F/f, and the signal is said to be down-sampled. The coefficients are the bandpass modulated coefficients of a lowpass prototype filter designed to support the bandwidth of the target signal. A description of bandpass modulation can be found in "Digital Signal Processing in Communication Systems", pages 171–174, by Marvin E. Frerking, Van Nostrand Reinhold, New York, 1994. In one embodiment, modulators 12a and 12b are identical and therefore use the same predictor filter coefficients.

Figure 9:
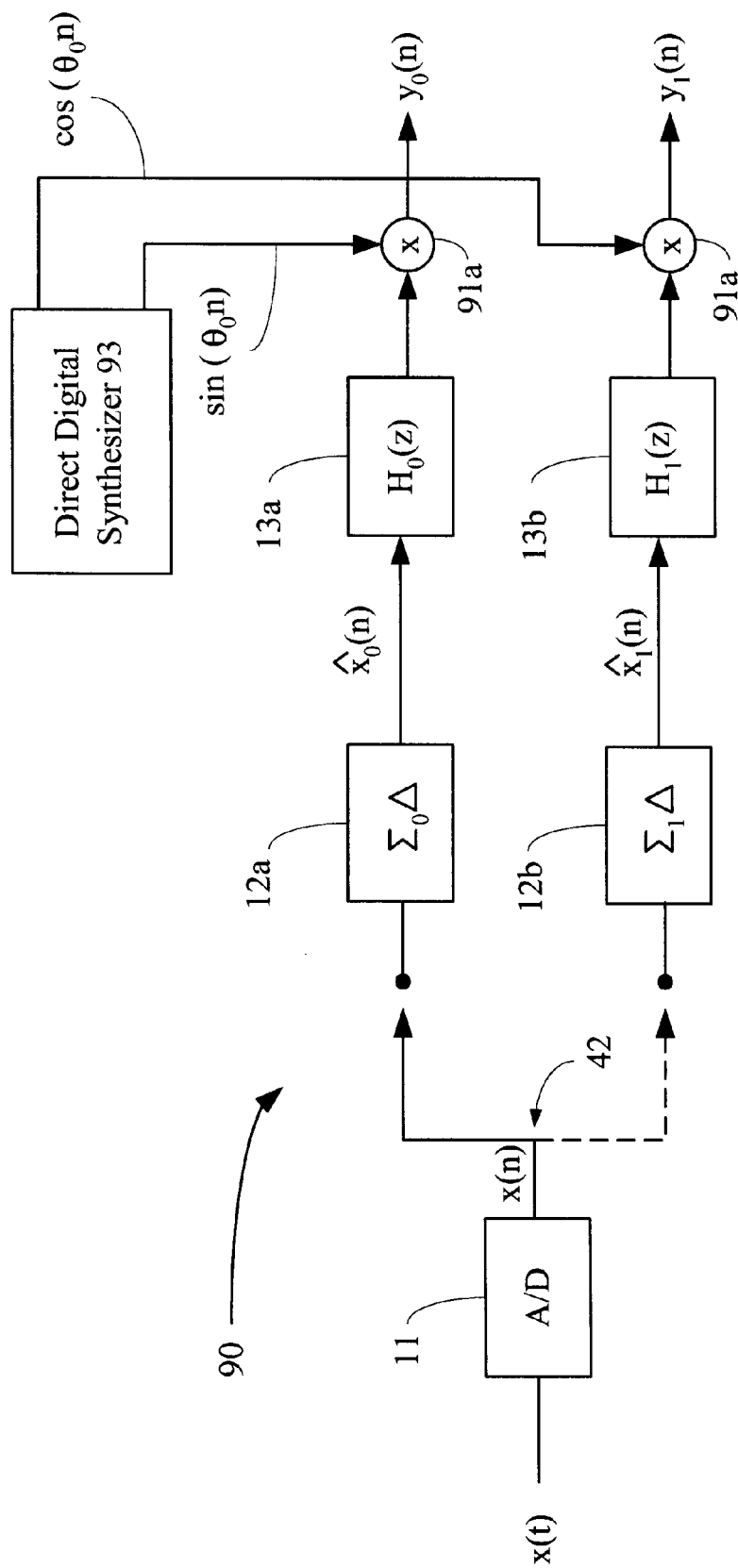

FIG. 9 illustrates another decimator configuration in which the output data samples are converted to baseband using a complex quadrature heterodyne arrangement. This configuration may be useful in a system where it is required to have a desired signal at baseband (that is, centered around 0 Hz). One such example application would be a digital communication receiver.

The direct digital systhesizer (DDS) 93 generates a complex sinusoid of frequency $\theta_0$. The complex sinusoid consists of two components: an in-phase component $\cos(\theta_0 n)$ and a quadrature component $\sin(\theta_0 n)$. Multipliers 91a and 91b multiply the outputs of filters 13a and 13b with this complex sinusoid. This operation translates a band of frequencies centered at $\theta_0$ radians per second down to baseband (i.e. 0 Hz). This process is well known and is described in further detail in "Digital Signal Processing in Communication Systems" pages 124–128, by Marvin E. Frerking, Van Nostrand Reinhold, New York, 1994.

Although only m=2-phase decimators have been described and illustrated, the invention is not so limited, and can be practiced using a polyphase decimator having any suitable number of phases.

In accordance with the present invention, the center frequency of prediction filter 12 must be designed to predict samples in the required spectral region based on the output sample rate. For example, consider m=2, and the required channel center frequency located at 0.1 Hz, normalized with respect to the input sample rate. In this example, the prediction filter must be designed with a center frequency located at 0.2 Hz.

To improve the quality of the prediction, a predictor filter 40 should operate over a wider fractional bandwidth than FIR filter 13. Therefore, more taps should be provided in predictor filter 40 than in FIR filter 13. As appreciated by those skilled in the art, the increase in complexity of the modulator must be balanced against the savings that result in the reduced complexity FIR filter to confirm that a net savings in logic resources is produced. To more clearly demonstrate this concept, consider a 2:1 decimator configuration similar to FIG. 9, a channel center frequency at 0.2 Hz; and a 60 dB dynamic range requirement.

Figure 10A:
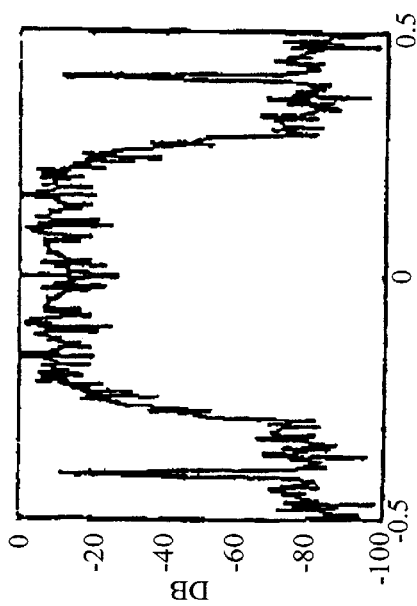
FIGS. 10a to 10f are graphs illustrating the performance of a decimator configuration of the present narrow-band filter.
Figure 10B:
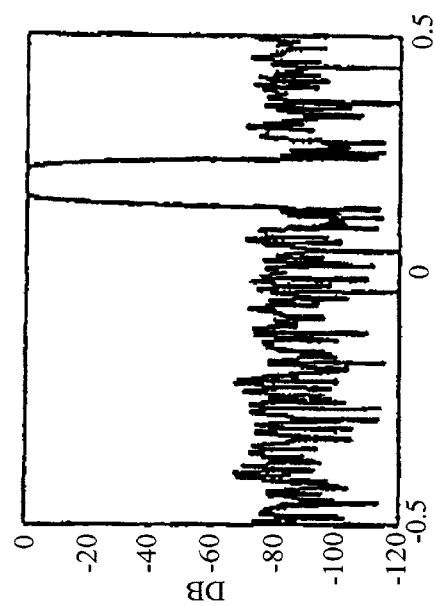
Figure 10C:
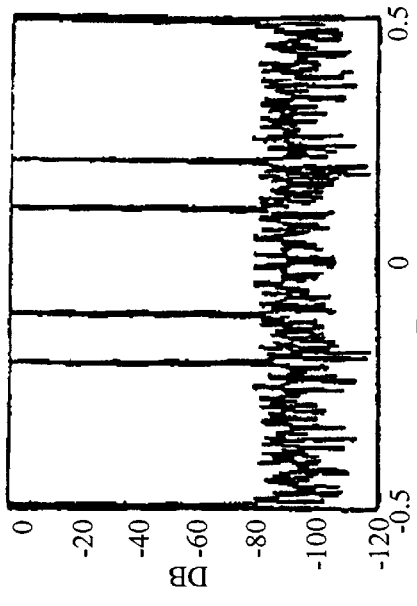
Figure 10D:
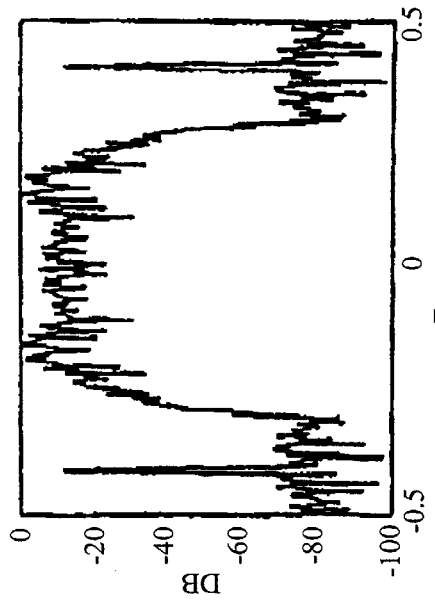

FIG. 10a illustrates the double-sided spectrum of an input test signal. The input signal is commutated between modulators 12a and 12b to produce the two low precision sequences $\hat{x}_0(n)$ and $\hat{x}_1(n)$. The respective spectrums of these two signals are shown in FIGS. 10b and 10c. The complex decimation filter response is defined in FIG. 10d.

After filtering by FIR filter sections 13a and 13b, a complex sample stream supported at the low output sample rate is produced. This spectrum, shown in FIG. 10e, shows that the out-of-band components in the test signal have been rejected by the specified amount and the in-band data meets the 60 dB dynamic range requirement. For comparison, the signal spectrum resulting from applying the processing stages in the order, re-quantized, decimate, and filter (described in reference to FIG. 6) is shown in FIG. 10f.

Figure 10F:
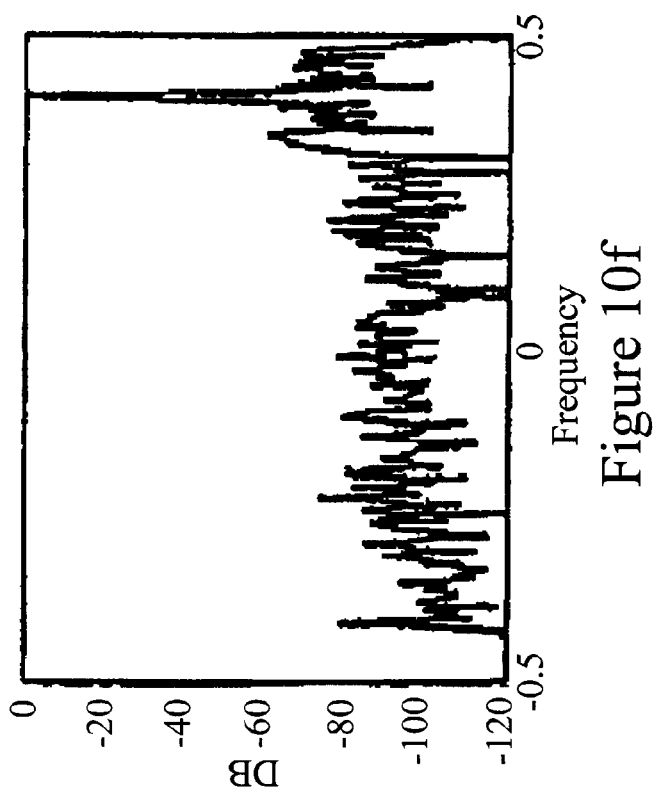
Figure 10E:
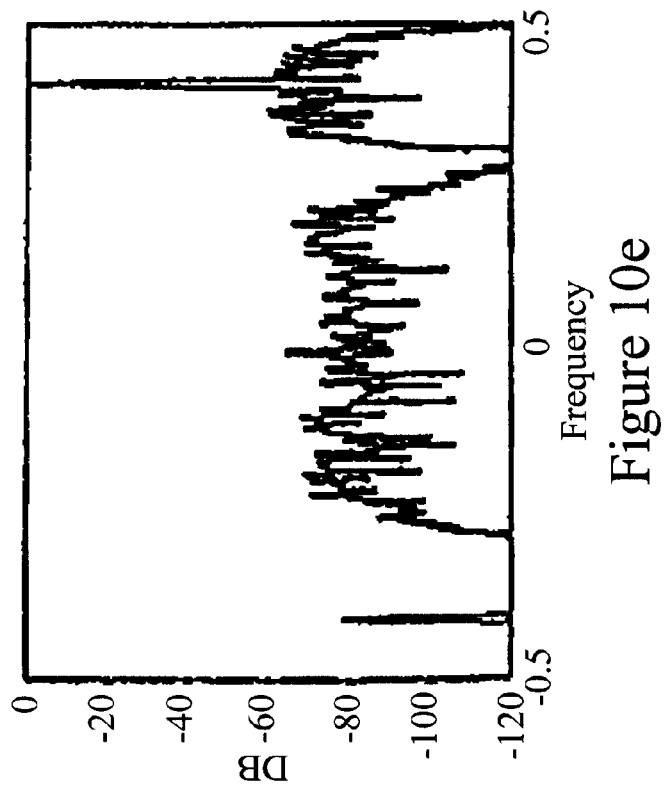

Thus, while the dual modulator approach satisfies the system performance requirements, its out-of-band performance is not quite as good as the response shown in FIG. 10f. In fact, the stopband performance of the dual modulator architecture has degraded by approximately 6 dB. This degradation can be explained by noting that the shaping noise produced by each modulator is essentially statistically independent. Because there is no coupling between these two components prior to filtering, complete phase cancellation of the modulator noise cannot occur in the polyphase filter.

COMPARATIVE EXAMPLE

To provide a frame of reference for the $\Sigma\Delta$ decimator, consider an implementation that does not pre-process the input data, but instead applies it directly to a polyphase decimation, FIR filter. A complex filter processing real-valued data consumes double the FPGA resources of a filter with real weights. For N=160, 15344 CLBs are required (based on a cost of 40 CLBs for each multiplier, and 8 CLBs for an add-delay component). In the dual modulator approach, the area cost $\Gamma(PRE)$ for this predictor filter is:

$$\Gamma(PRE)=2\Gamma(\Sigma\Delta)+\Gamma(MUL))+\Gamma(ACC\_z^{-1})$$

where $\Gamma(\Sigma\Delta)$ represents the FPGA area cost for one $\Sigma\Delta$ modulator, $\Gamma(MUL)$ represents the logic needed for a reduced precision multiplier, and $\Gamma(ACC\_Z^{-1})$ represents the FPGA area cost for and add-delay datapath component. Using the FIR filter specifications defined earlier, and 18-tap prediction filters, $\Gamma(FIR)=2\times738+2\times((160+159)\times8)=6596$. Comparing the area requirements of the two options produces the ratio:

$$\lambda = \frac{\Gamma(FIR)}{\Gamma(PRE)} = 6596/15344 \approx 43\%$$

Thus, for this example, the re-quantization approach has produced a result that is significantly more area efficient than a standard tapped-delay line implementation.

Center Frequency Tuning

For both the single-phase and polyphase $\Sigma\Delta$ modulator based architectures, the center frequency is defined by the coefficients in predictor filter 40 and in FIR filter 13. As noted previously, the filter coefficients are reflected in the contents of the LUTs of the coefficients. Also as previously noted, the LUTs are implemented in an FPGA using the function generators in the CLBS. When the center frequency is to be changed, the user will reconfigure the FPGA, thereby updating the LUTs to reflect the new channel requirements. If only several channel locations are anticipated, separate configuration bit streams could be stored, and the FPGA(s) re-configured as needed.

Predictor Filter Design

The design of predictor filter 40 involves signal estimation. The optimum predictor is designed from a statistical viewpoint. The optimization criterion is based on the minimization of the mean-squared error. As a consequence, only the second-order statistics (autocorrelation function) of a stationary process are required in the design of predictor filter 40.

The procedure is almost the same method used to solve for the synthesis filter coefficients in linear predictive coding (LPC) using the autocorrelation method as described in "Discrete Time Processing of Speech Signals", pages 273–280, by John R. Deller, Jr. et al., Macmillan Publishing Company, Maxwell Macmillan International, New York, 1993.

Figure 11:
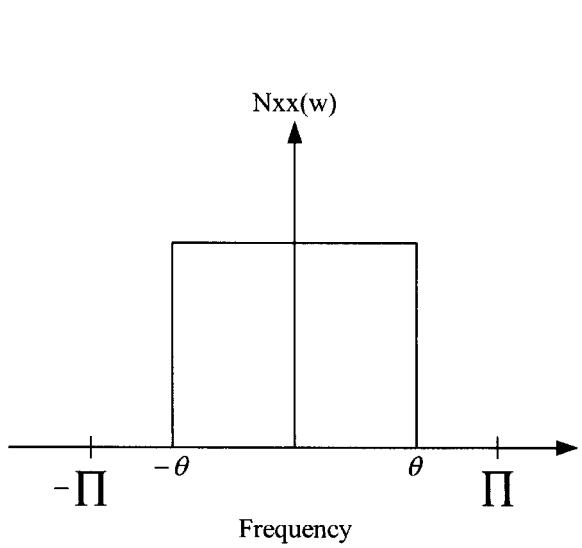
FIG. 11 is a graph illustrating the design of the predictor filter.

Predictor filter 40 is designed to predict samples of a band-limited white noise process $N_{xx}(\omega)$ shown in FIG. 11. $N_{xx}(\omega)$ is defined as:

$$N_{xx}(\omega) = \begin{cases} 1 & -\theta \leq \omega \leq \theta \\ 0 & \text{otherwise} \end{cases}$$

and related to the autocorrelation sequence $r_{xx}(m)$ by discrete-time Fourier transform (DTFT).

$$N_{xx}(\omega) = \sum_{n=-\infty}^{\infty} r_{xx}(k) e^{-j\omega n}$$

The autocorrelation function $r_{xx}(n)$ is found by taking the inverse DTFT of the equation immediately above.

$$r_{xx}(n) = \frac{1}{2\pi} \int_{-\pi}^{\pi} N_{xx}(\omega) e^{-j\omega n} d\omega$$

$N_{xx}(\omega)$ is non-zero only in the interval $-\theta \leq \omega \leq \theta$ giving $r_{xx}(n)$ as:

$$r_{xx}(n) = \frac{\theta}{\pi} \text{sinc}(\theta n)$$

Thus, the autocorrelation function corresponding to a band-limited white noise power spectrum is a sinc function. Samples of this function are used to construct an autocorrelation matrix which is used in the solution of the normal equations to find the required coefficients. Leaving out the scaling factor in the immediately above equation, the required autocorrelation function $r_{xx}(n)$, truncated to p samples, is defined as:

$$r_{xx} = \frac{\sin(n\theta)}{n\theta} \quad n = 0, \ldots, p-1$$

The normal equations are defined as:

$$r_{xx}(m) = \sum_{k=1}^{p} a(k) r_{xx}(m-k) \quad m = 1, 2, \ldots, p$$

This system of equations can be compactly written in matrix form by first defining several matrices.

To design a p-tap error predictor filter first compute a sinc function consisting of p+1 samples and construct the autocorrelation matrix $R_{xx}$ as:

$$R_{xx} = \begin{bmatrix} r_{xx}(0) & r_{xx}(1) & \cdots & r_{xx}(p-1) \\ r_{xx}(1) & r_{xx}(0) & \cdots & r_{xx}(p-2) \\ \vdots & \vdots & \vdots & \vdots \\ r_{xx}(p-1) & r_{xx}(p-2) & \cdots & r_{xx}(0) \end{bmatrix}$$

Next, define a filter coefficient row-vector A as:

$$A = [a(0), a(1), \ldots, a(p-1)]$$

where $a(i)$, $i=0, \ldots, p-1$, are the predictor filter coefficients. Let the row-vector $R'_{xx}$ be defined as:

$$R'_{xx} = [r_{xx}(1), r_{xx}(2), \ldots, r_{xx}(p)]$$

The matrix equivalent of the above normal equations is:

$$R_{xx} A^T = (R'_{xx})^T$$

The filter coefficients are therefore given as:

$$A^T = R_{xx}^{-1} (R'_{xx})^T$$

For the case in-hand, the solution of the immediately above equation is an ill-conditioned problem. To arrive at a solution for A, a small constant $\epsilon$ is added to the elements along the diagonal of the autocorrelation matrix $R_{xx}$ in order to raise its condition number. The actual autocorrelation matrix used to solve for the predictor filter coefficients is:

$$R_{xx} = \begin{bmatrix} r_{xx}(0)+\varepsilon & r_{xx}(1) & \cdots & r_{xx}(p-1) \\ r_{xx}(1) & r_{xx}(0)+\varepsilon & \cdots & r_{xx}(M-2) \\ \vdots & \vdots & \vdots & \vdots \\ r_{xx}(p-1) & r_{xx}(p-2) & \cdots & r_{xx}(0)+\varepsilon \end{bmatrix}$$

Bandpass Predictor Filter

The previous section described the design of a lowpass predictor. In this section, bandpass processes are considered.

A bandpass predictor filter is designed by modulating a lowpass prototype sinc function to the required center frequency $\theta_0$. The bandpass predictor coefficient $h_{BP}(n)$ is obtained from the prototype lowpass sinc function $h_{LP}(n)$ as:

$$h_{BP}(n) = h_{LP}(n) \cos(\theta_0(n-k)) \quad n=0, \ldots, 2p$$

where $$k = \left[\frac{2p+1}{2}\right].$$

Highpass Predictor Filter

A highpass predictor filter is designed by highpass modulating a lowpass prototype sinc function to the required corner frequency $\theta_C$. The highpass predictor coefficients $h_{HP}(n)$ are obtained from the prototype lowpass sinc function $h_{LP}(n)$ as:

$$h_{HP}(n) = h_{LP}(n)(-1)^{n-k} \quad n=0, \ldots, 2p$$

SUMMARY

The present invention provides an improved method for implementing narrow-band filters using FPGA technology. The source data re-quantization approach is suitable for both single-phase and polyphase architectures. The present invention provides the DSP/FPGA engineer with another tool that is useful for certain filtering requirements. For the examples presented above, logic savings in excess of 50% were demonstrated. As the frequency band of interest occupies a smaller fractional bandwidth, the order of the required filter increases. This growth tends to make the data re-quantization more attractive, as the cost of the modulator consumes a decreasing proportion of the entire design.

Various modifications will be apparent to those skilled in the art after reading the present disclosure. For example, although various filters were described as being implemented in the Xilinx XC4000 or Virtex FPGA, it will be understood that the invention is not so limited, and that the invention can be practiced using any other suitable FPGA or other type of programmable logic device (PLD). Further, note that although the filters are shown with a limited number of taps, a practical filter implemented in an FPGA typically has hundreds of taps. Thus, the present invention is limited only by the following claims.

What is claimed is:

1. A narrow-band filter implemented in a programmable device (PLD), comprising:

a re-quantizer for receiving quantized input data samples with a first degree of precision and re-quantizing the quantized input data samples with a second, lower degree of precision to produce re-quantized data samples, the re-quantizer being configured to redistribute noise such that the noise is substantially minimum at a predetermined center frequency;

a filter for receiving and filtering the re-quantized data samples, the filter configured in m sections and having a passband which includes said center frequency;

an m-phase input commutator having m output terminals connectable to the input terminals of the sections respectively; and a combiner for combining output signals of the sections.

2. The narrow-band filter of claim 1, wherein the commutator is coupled between the re-quantizer and the filter.

3. The narrow-band filter of claim 1, wherein the re-quantizer is configured in m sections having input terminals connectable to the output terminals of the commutator and output terminals connected to the input terminals of the sections of the bandpass filter respectively.

4. The narrow-band filter of claim 1, further comprising a quadrature baseband converter connected to an output terminal of the m sections of the bandpass filter.

* * * * *